us007719091B2

United States Patent
Brogle

(10) Patent No.: US 7,719,091 B2
(45) Date of Patent: May 18, 2010

(54) DIODE WITH IMPROVED SWITCHING SPEED

(75) Inventor: James Joseph Brogle, Woburn, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 10/185,128

(22) Filed: Jun. 28, 2002

(65) Prior Publication Data

US 2004/0000699 A1    Jan. 1, 2004

(51) Int. Cl.
    *H01L 39/00* (2006.01)
(52) U.S. Cl. .............................. 257/656; 257/E29.336
(58) Field of Classification Search .................. 257/104, 257/105, 106, 603, 604, 605, 606, 656, E29.336, 257/109, 111, 112, 481, 482, 29.337, 29.338, 257/29.339, 655, 657, E29.338, E29.327, 257/E29.328, E29.329, E29.333, E29.334
See application file for complete search history.

(56) References Cited

U.S. PATENT DOCUMENTS

| 3,254,234 | A | * | 5/1966 | Sziklai et al. ............... 327/195 |
| 4,119,440 | A | * | 10/1978 | Hile ............................ 438/533 |
| 4,405,932 | A | * | 9/1983 | Ishii et al. .................... 257/497 |
| 4,446,478 | A | * | 5/1984 | Bacuvier ...................... 257/161 |
| 4,605,943 | A | * | 8/1986 | Nakamura et al. ............ 257/84 |
| 4,724,475 | A | * | 2/1988 | Matsuda ...................... 257/785 |
| 4,910,570 | A | * | 3/1990 | Popovic ...................... 257/290 |
| 4,928,157 | A | * | 5/1990 | Matsunaga et al. .......... 257/362 |
| 5,239,193 | A | * | 8/1993 | Benton et al. ............... 257/292 |
| 5,498,907 | A |   | 3/1996 | Tumpey et al. .............. 257/724 |
| 5,554,882 | A | * | 9/1996 | Falk ............................ 257/605 |
| 5,610,434 | A |   | 3/1997 | Brogle et al. ................ 257/619 |
| 5,677,562 | A |   | 10/1997 | Korwin-Pawlowski et al. ... 257/490 |
| 6,111,305 | A | * | 8/2000 | Yoshida et al. .............. 257/656 |
| 6,268,286 | B1 | * | 7/2001 | Gauthier et al. ............. 438/655 |

OTHER PUBLICATIONS

U.S. Appl. No. 10/139,067, filed May 3, 2002, entitled "Heterojunction P-I-N Diode and Method of Making the Same".

* cited by examiner

*Primary Examiner*—Bradley K Smith
*Assistant Examiner*—Amar Movva
(74) *Attorney, Agent, or Firm*—Christopher P. Maiorana, PC

(57) ABSTRACT

A diode having a first semiconductor region of a first polarity and a second semiconductor region of an opposite polarity at least partially surrounding the first semiconductor region. A metal contact coupled to the second semiconductor region at least partially surrounding the first semiconductor region. The diode offers improvements in switching speed.

10 Claims, 3 Drawing Sheets

DIODE WITH IMPROVED SWITCHING SPEED

FIELD OF THE INVENTION

The present invention relates to electronics and, more particularly, to diodes with improved switching speeds.

BACKGROUND OF THE INVENTION

Diodes are well known electronic components that tend to conduct electric current in only one direction. A diode includes a p-type region (e.g, a semiconductor region doped with a p-type material) and an n-type region (e.g., a semiconductor region doped with n-type material). The p-type region and the n-type region may be coupled together at a junction to form a PN junction diode or separated by an intrinsic (i) type region to form a PIN diode. The diode further includes two metal contacts (i.e., electrodes) called the anode and the cathode that are coupled to the p-type region and the n-type region, respectively. When the anode is positively charged relative to the cathode at a voltage greater than a certain minimum voltage, i.e., the turn-on voltage, current flows through the diode from the p-type region to the n-type region. Diodes having metal contacts that terminate on the same plane (i.e., coplanar) are planar diodes.

FIG. 1A depicts a partial plan view of a prior art planar PIN diode 100 and FIG. 1B is a cross-sectional view of the planar diode 100 of FIG. 1A, with like elements having identical numbers. For descriptive purposes, the partial plan view depicted in FIG. 1A excludes certain layers depicted in FIG. 1B, such as silicon dioxide layers 114, silicon nitride layers 116, and a glass layer 118. Additionally, the partial plan view depicts only the portions of metal contacts 110 and 112 that are in contact with underlying semiconductor regions 104 and 106.

The planar diode 100 is fabricated on a semiconductor wafer 102 by creating a p-type region 104 and an n-type region 106 that are separated by an i-type region 108. As shown in FIGS. 1A and 1B, the n-type region 106 surrounds the i-type region 108 and the p-type region 104. The i-type region 108 is a planar region beneath and larger than the p-type region 104 and the n-type region 106 is a planar region beneath and larger than the i-type region 108.

Electrical contact with the p-type region 104 is facilitated by the addition of a metal contact 110 on top of and coupled to the p-type region 104. Likewise, electrical contact with the n-type region 106 is facilitated by the addition of a metal contact 112 coupled to the n-type region 106. As illustrated, the metal contacts 110, 112 are separate, distinct circular regions.

Silicon dioxide layers 114 and silicon nitride layers 116 reduce parasitic capacitance and provide an interface between the wafer 102 and a glass layer 118. The glass layer 118 further reduces parasitic capacitance and acts as a low-loss substrate for transmission lines. The metal contacts 110 and 112 are coupled to the p-type region 104 and the n-type region 106, respectively, through contact holes 120 and 122 that extend through the silicon dioxide layers 114, silicon nitride layers 116, and glass layer 118.

Diodes are used in many electronic applications. To select a diode for use in a particular application, the characteristics of the diode are matched to the particular application. One common diode characteristic is switching speed, which is a measure of how quickly the diode turns off (i.e., achieves a high impedance state) when switched from forward conduction to reverse conduction. There is an ever present need for diodes with improved switching speeds. The present invention fulfills this need among others.

SUMMARY OF THE INVENTION

The present invention provides for a diode with improved switching speed. The inventive diode includes a first semiconductor region of one polarity (e.g., a p-type region) surrounded by a second semiconductor region of an opposite polarity (e.g., a n-type region) where a metal contact coupled to the second semiconductor region at least partially surrounds the first semiconductor region.

One aspect of the present invention is a planar diode with improved switching speed. The planar diode includes a first region of a first polarity; a second region of a second polarity at least partially surrounding the first region; and a first metal contact coupled to the second region, the first metal contact at least partially surrounding the first region.

DETAILED DESCRIPTION OF THE INVENTION

Figure 1A:
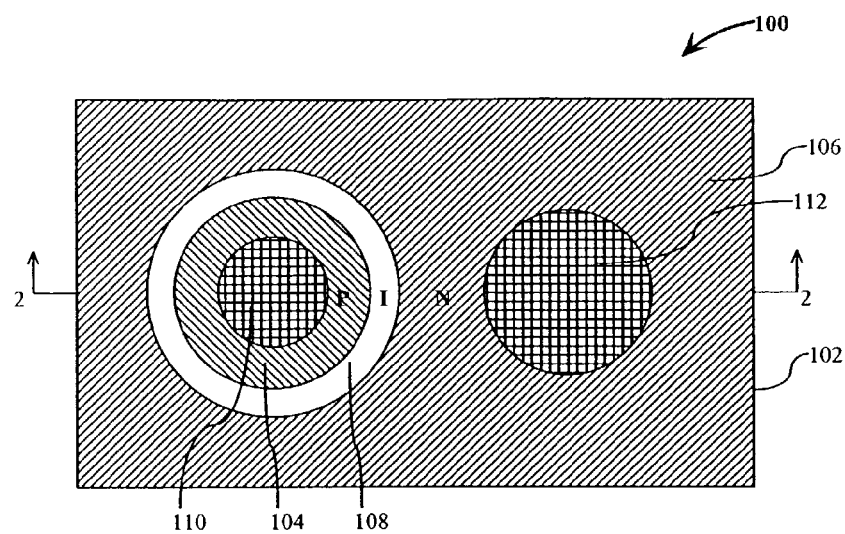
FIG. 1A is a partial top plan view of a prior art planar diode.
Figure 1B:
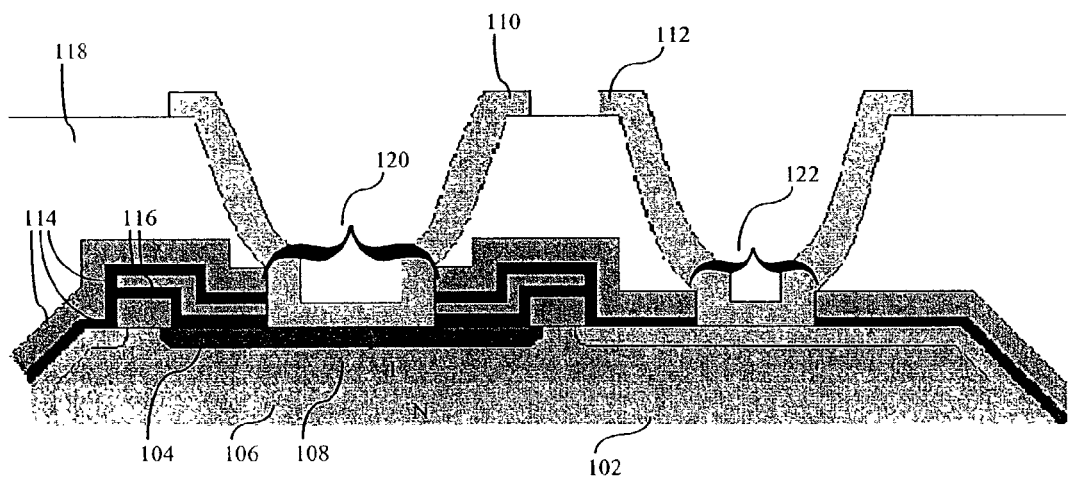
FIG. 1B is a cross-sectional view of the planar diode of FIG. 1A.
Figure 2A:
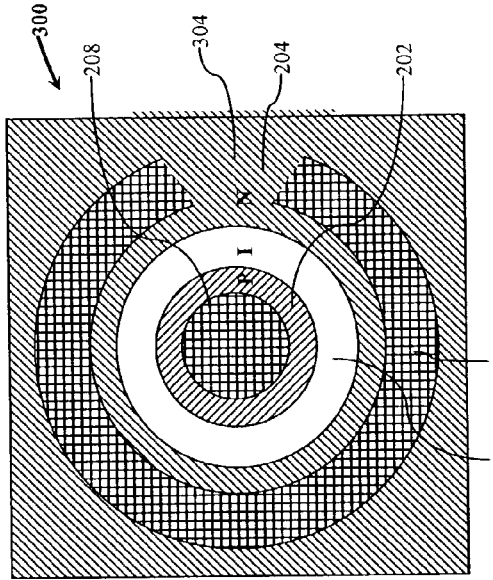
FIG. 2A is a partial top plan view of a planar diode with an annular metal contact in accordance with the present invention.
Figure 2B:
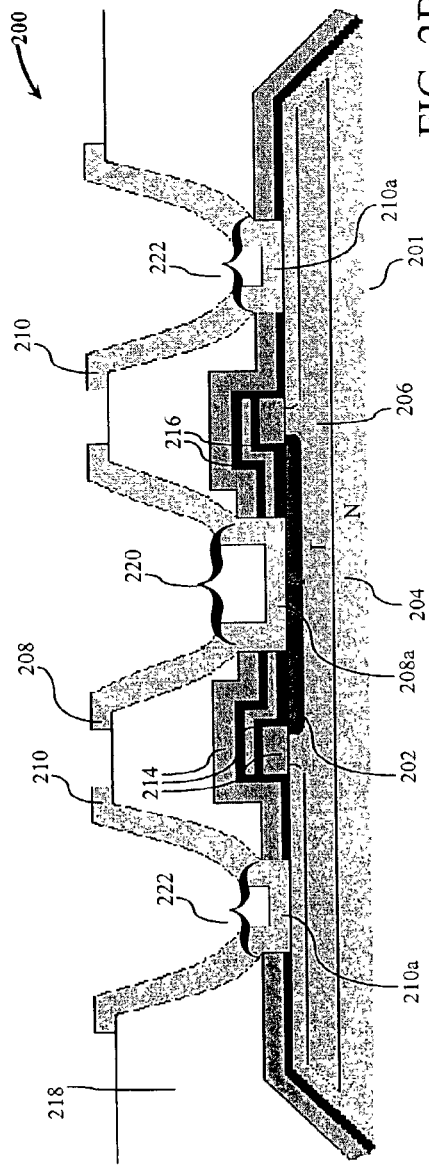
FIG. 2B is a cross-sectional view of the planar diode of FIG. 2A.

FIGS. 2A and 2B depicts a top plan view and a cross-section side view, respectively, of a planar diode 200 in accordance with one embodiment of the present invention. For descriptive purposes, the partial plan view depicted in FIG. 2A excludes certain layers depicted in FIG. 2B, such as silicon dioxide layers 214, silicon nitride layers 216, and a glass layer 218. Additionally, the partial plan view depicts only the portions of metal contacts 208 and 210 that are in contact with underlying semiconductor regions 202 and 204.

The planar diode 200 includes a p-type region 202 and an n-type region 204 completely encircling and beneath the p-type region 202. In the illustrated embodiment, the p-type region 202 and the n-type region 204 are separated by an optional intrinsic (i) type region 206 interposed between the p-type region 202 and the n-type region 204 to form a PIN diode. In the absence of the intrinsic region 206, the p-type region 202 and the n-type region 204 contact one another to form a PN junction diode. It will be readily apparent to those skilled in the art that the regions 202 and 204 may be reversed such that the region identified as the p-type region 202 may be an n-type region and the region identified as the n-type region 204 may be a p-type region. The planar diode 200 is well suited for fabrication as part of an integrated circuit or as a discrete component.

Figure 3:
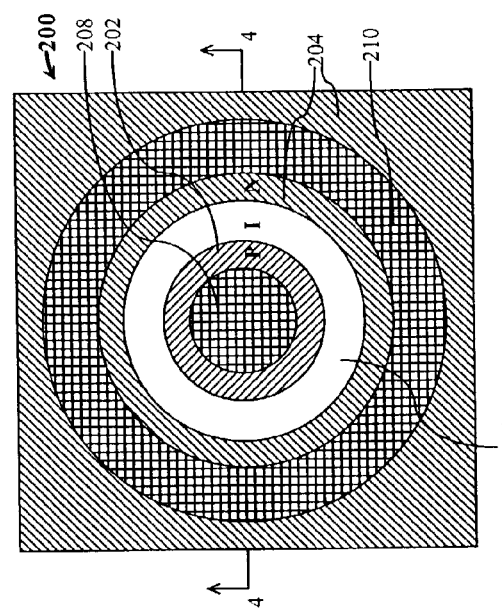
FIG. 3 is a partial top plan view of an alternative planar diode with a semicircular metal contact in accordance with the present invention.

A first metal contact 208 is coupled to the p-type region 202 and a second metal contact 210 is coupled to the n-type region 204 to facilitate electrical contact with their respective regions. In the illustrated planar diode 200, the first metal contact 208 is a circular area and the second metal contact 210 completely encircles the p-type region 202 and the first metal contact 208 in an annular manner. As will be described in greater detail below, the p-type region 202 extends beneath and is larger than the contact area 208a of the first metal contact 208 and the n-type region 204 extends below and is larger than the contact area 210a of the second metal contact 210. FIG. 3 depicts a planar diode 300 that is essentially identical to the planar diode 200 of FIGS. 2A and 2B, except for the second metal contact 302, with like elements having identical numbers. In FIG. 3, the second metal contact 302 partially encircles the p-type region 202 and the first metal contact 208, rather than completely encircling these regions as in FIG. 2A. Accordingly, a gap 304 exists in the second metal contact 302 encircling the p-type region 202 and the first metal contact 208 in the planar diode 300. This gap 304 facilitates a transmission line connection to the first metal contact 208 with low parasitic capacitance.

The planar diode 200 is fabricated on a semiconductor wafer 201. The p-type region 202, the n-type region 204, the i-type region 206 (optionally), the first metal contact 208, and the second metal contact 210 may be fabricated on the semiconductor wafer 201 using conventional techniques. Preferably, the semiconductor wafer 201 is a conventional wafer of semiconductor material such as silicon doped with an n+ material.

If present, the i-type region 206 separates the p-type region 202 from the n-type region 204. In the illustrated embodiment, the intrinsic region 206 forms a plane beneath the metal contacts 208 and 210 and surrounds the p-type region 202. Preferably, the i-type region 206 is a layer of ultra-pure silicon epitaxially grown on the semiconductor wafer 201.

The p-type region 202 is coupled to the first metal contact 208. In the illustrated embodiment, the p-type region 202 forms a plane beneath the first metal contact 208. Preferably, the p-type region 202 is created by diffusing a first portion of the epitaxially grown i-type region 206, if present, with a p+ material such as Boron.

The n-type region 204 is coupled to the second metal contact 210 and surrounds the p-type region 202 and, if present, the i-type region 206. In a preferred embodiment, the n-type region 204 extends below the p-type region 202, the intrinsic region 206, and the first and second metal contacts 208 and 210. Preferably, the n-type region 204 includes the semiconductor wafer 201 doped with n+ material and further includes an area created by diffusing a second portion of the intrinsic region 206 with an n+ material such as Phosphorous. The second portion of the intrinsic region 206 diffused with the n+ material is essentially electrically identical to the substrate 201 doped with n+ material.

In an alternative embodiment, if the intrinsic region 206 is not present, the n-type region 204 may include a semiconductor wafer 201 doped with an n+ material and a p-type region 202 created by diffusing a first portion of the semiconductor wafer 201 with a p+ material.

Silicon dioxide layers 214 and silicon nitride layers 216 are used in the fabrication of the p-type region 202, the n-type region 204, and the i-type region 206; to reduce parasitic capacitance; and to provide an interface between the glass layer 218 and the p-type region 202, the n-type region 204, and the i-type region 206. The glass layer 218 further reduces parasitic capacitance and acts as a low-loss substrate for transmission lines. The formation of the silicon dioxide layers 214, the silicon nitride layers 216, and the glass layer 218 will be readily apparent to those skilled in the art.

The first metal contact 208 is coupled to the p-type region 202 through a contact hole 220 below the first metal contact 208 and the second metal contact 210 is coupled to the n-type region 204 through a contact channel 222 below the second metal contact 210. In a preferred embodiment, the metal contacts 208 and 210 are formed by etching the silicon dioxide layers 214, the silicon nitride layers 216, and the glass layer 218 to form the contact hole 220 and the contact channel 222. One or more layers of metal are deposited in a known manner to fill the contact hole 220 and the contact channel 222. Excess metal is then removed to form the metal contacts 208 and 210. Preferably, the metal contacts 208 and 210 include a layer of Titanium, a layer of Platinum, and a layer of Gold (e.g., Ti-1000 Å, Pt-1000 Å, and Au-25000 Å).

Figure 4:
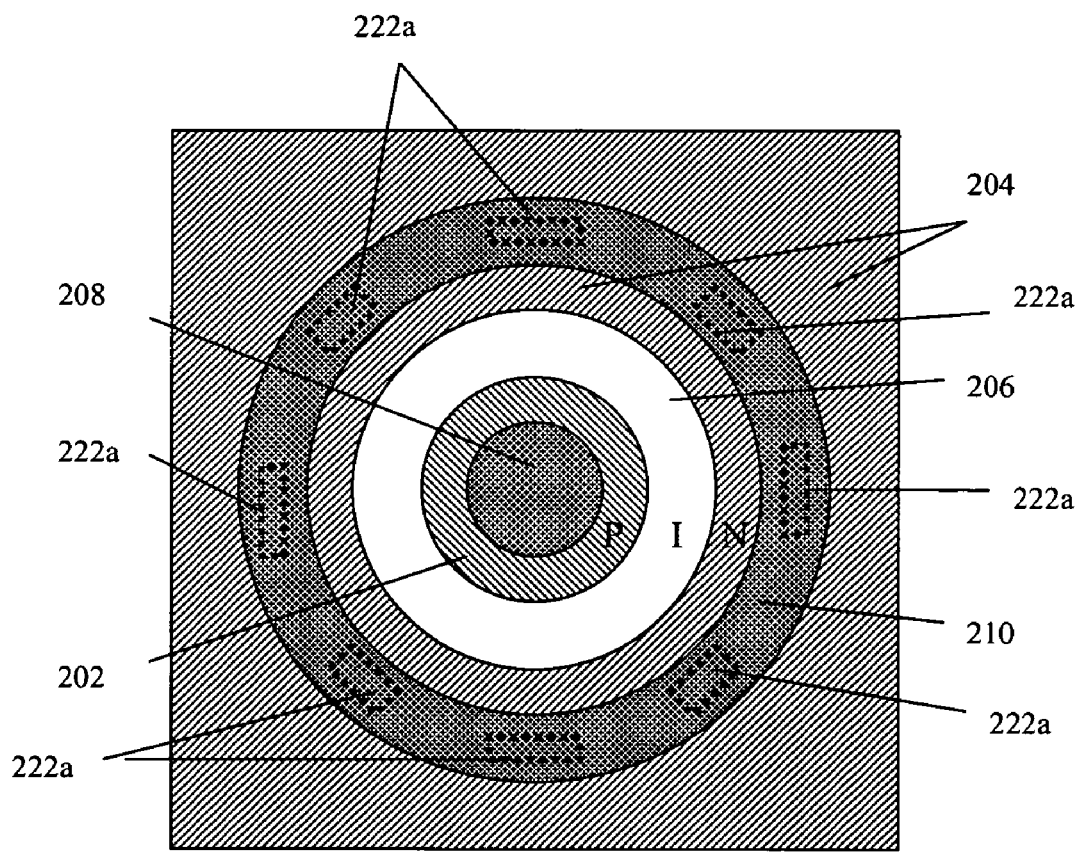
FIG. 4 is a diagram showing an alternative embodiment of a planar diode in accordance with the present invention.

In accordance with one embodiment, the second metal contact 210 and the contact channel 222 completely encircle the p-type region 202 and the first metal contact 208 in an annular manner as shown in FIG. 2A. In an alternative embodiment, as shown in FIG. 3, the second metal contact 210 and the contact channel 222 partially encircle the p-type region 202 and the first metal contact 208 in a semicircular manner. In a preferred embodiment, the contact channel 222 is a continuous channel that allows the second metal contact 210 to contact the n-type region 204 along the second metal contact's entire length. Alternatively, it is contemplated that the contact channel 222 may comprise a plurality of contact holes below the second metal contact 210 that allow the second metal contact 210 to contact the n-type region 204 intermittently along its length, as illustrated in phantom in FIG. 4. Particularly, FIG. 4 is an overhead plan view like FIGS. 2 and 3, except that the intermittent contact layer to N region 204, which is beneath the metal contact 210 and therefore would not be visible in an overhead plan view, is shown in phantom (i.e. dashed line) at 222a.

In an actual implementation of the planar diode 200 (FIGS. 2A and 2B), using a silicon semiconductor material and conventional dopants, improvements in switching speeds of approximately 20% over conventional planar diodes were achieved with minimal impact on total capacitance (Ct), e.g., less than 10%, and negligible impact on forward voltage drop (Vf).

Having thus described a few particular embodiments of the invention, various alterations, modifications, and improvements will readily occur to those skilled in the art. For example, although a planar diode has been described, the present invention is applicable to other diode designs. In addition, although the diffusion and metal contacts have been illustrated as having circular or semicircular shapes, the metal contacts may have essentially any geometric pattern such as ovals, squares, diamonds, rectangles, etc., including portions and/or combination thereof. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:
1. A diode comprising:
a first region of a first polarity type, wherein said first region is one of an anode and a cathode of said diode;
a second region of a second polarity type beneath, larger than, and substantially surrounding said first region wherein said second region is the other of said anode and said cathode of said diode, a junction between said first region and said second region forming a diode junction;
an intrinsic region separating said first region from said second region, said diode junction further comprising said intrinsic region;

a generally annular metal contact coupled to said second region, said generally annular metal contact at least partially encircling said first region in the form of an annulus having a gap in said annulus, wherein (i) said second region comprises a plurality of contact holes below said generally annular metal contact, (ii) said plurality of contact holes comprise less than the entire surface area of said second region under said generally annular metal contact, and (iii) said generally annular metal contact makes conductive contact with said second region only through said plurality of contact holes; and a metal contact coupled to said first region;

wherein said metal contacts are coplanar.

2. The diode of claim 1, wherein said second region completely surrounds said first region.

3. The diode of claim 1, wherein said metal contact that is coupled to said second region partially surrounds said metal contact that is coupled to said first region.

4. The diode of claim 1, wherein said first region is substantially circular and said second region larger than said first region.

5. A planar diode comprising:
a positively doped region, wherein said positively doped region is one of an anode and a cathode of said diode;
a first metal contact coupled to said positively doped region;
a negatively doped region beneath, larger than, and substantially completely surrounding said positively doped region and said first metal contact, wherein said negatively doped region is the other of said anode and said cathode of said diode, a junction between said positively doped region and said negatively doped region forming a diode junction; and
a second metal contact coupled to said negatively doped region, said second metal contact at least partially encircling said positively doped region and said first metal contact in the form of an annulus having a gap in said annulus, wherein (i) said negatively doped region comprises a plurality of contact holes below said second metal contact, (ii) said plurality of contact holes comprise less than the entire surface area of said negatively doped region under said second metal contact, and (iii) said second metal contact makes conductive contact with said negatively doped region only through said plurality of contact holes;
an intrinsic region separating said positively and negatively doped regions, said diode junction further comprising said intrinsic region;

wherein said first and second metal contacts are coplanar.

6. The diode of claim 5, wherein said negatively doped region and said second metal contact completely surround said positively doped region.

7. A planar PIN diode comprising:
a positively doped region, wherein said positively doped region is one of an anode and a cathode of said diode;
a first metal contact coupled to said positively doped region;
a negatively doped region, wherein said negatively doped region is the other of said anode and said cathode of said diode beneath, larger than, and substantially completely surrounding said positively doped region and said first metal contact, a junction between said positively doped region and said negatively doped region forming a diode junction;
a second metal contact coupled to said negatively doped region, said second metal contact at least partially encircling said positively doped region and said first metal contact in the form of an annulus, wherein (i) said negatively doped region comprises a plurality of contact holes below said second metal contact, (ii) said plurality of contact holes comprise less than the entire surface area of said negatively doped region under said second metal contact, and (iii) said second metal contact makes conductive contact with said negatively doped region only through said plurality of contact holes; and
an intrinsic layer in said junction separating said positively and negatively doped regions, said diode junction further comprising said intrinsic layer;

wherein said metal contacts are coplanar.

8. The diode of claim 7, wherein said negatively doped region completely surrounds said positively doped region.

9. The diode of claim 7, wherein said second metal contact has a gap in said annulus.

10. The diode of claim 5 wherein said positively doped region comprises one of the anode and the cathode of said diode and said negatively doped region comprises the other of said anode and said cathode of said diode.

* * * * *